(12) United States Patent
Tang et al.

(10) Patent No.: US 7,969,164 B2
(45) Date of Patent: Jun. 28, 2011

(54) METHOD AND APPARATUS FOR MINI MODULE EMI SHIELDING EVALUATION

(75) Inventors: Jinbang Tang, Chandler, AZ (US); James E. Drye, Mesa, AZ (US); Scott M. Hayes, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 737 days.

(21) Appl. No.: 12/059,012

(22) Filed: Mar. 31, 2008

(65) Prior Publication Data

US 2009/0243629 A1    Oct. 1, 2009

(51) Int. Cl.
*G01R 27/28* (2006.01)
(52) U.S. Cl. ....................................... 324/627
(58) Field of Classification Search .................. 324/627
See application file for complete search history.

(56) References Cited

U.S. PATENT DOCUMENTS

| | | | |
|---|---|---|---|
| 5,828,220 A * | 10/1998 | Carney et al. | 324/627 |
| 6,201,403 B1 | 3/2001 | Rollin et al. | |
| 6,754,598 B2 | 6/2004 | Shimazaki et al. | |
| 7,173,434 B2 | 2/2007 | Tarvainen et al. | |

* cited by examiner

*Primary Examiner* — Amy He
(74) *Attorney, Agent, or Firm* — Michael Balconi-Lamica; Charles Bergere

(57) ABSTRACT

A method for mini module EMI shielding effectiveness evaluation comprises providing a test vehicle including at least one test platform. The test platform includes at least one mini emitter, a mini receiver with a reference shield, and a mini receiver with a shield under test. EMI shielding effectiveness transmission signals are applied to the at least one mini emitter. Signals received by the mini receiver with a shield under test and the mini receiver with the reference shield are evaluated. The mini emitter, mini receiver with the reference shield, and mini receiver with the shield under test comprise components fabricated concurrently and under fabrication conditions used for fabrication of the test platform of the test vehicle. As used herein, a mini emitter and mini receiver may be interchanged according to the requirements of a given EMI shielding effectiveness evaluation.

20 Claims, 8 Drawing Sheets

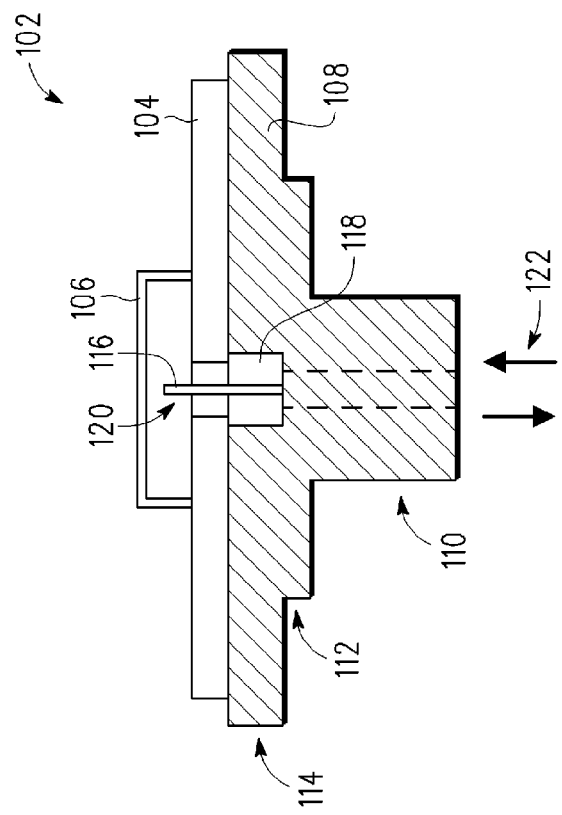
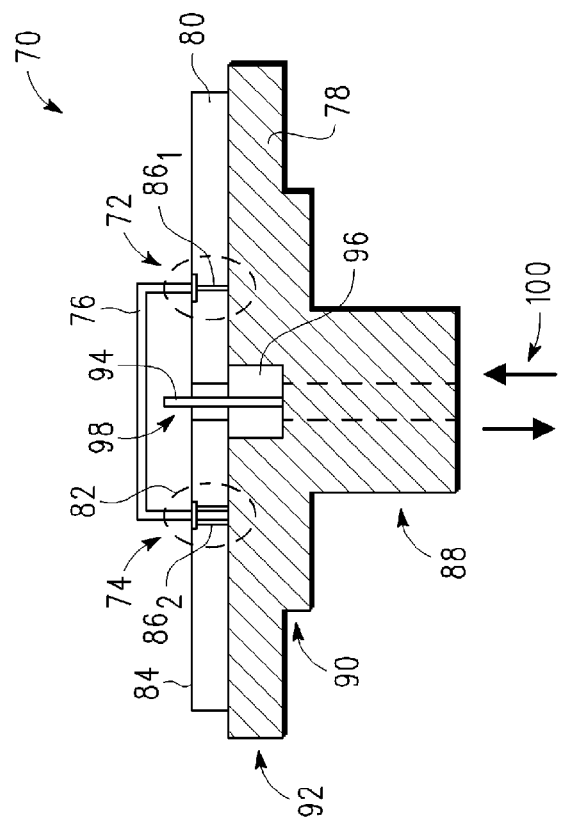

NEAR FIELD MEASUREMENTS

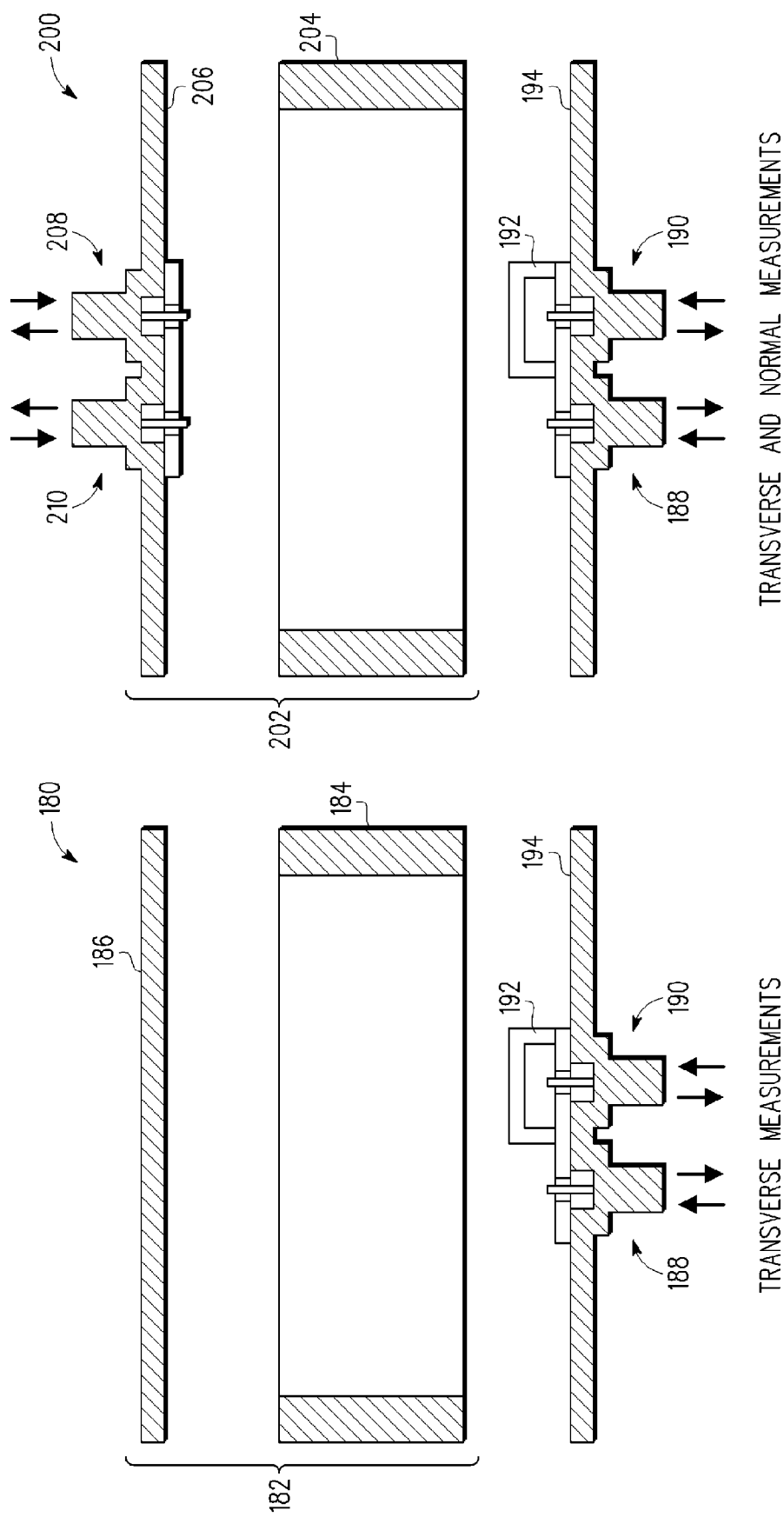

METHOD AND APPARATUS FOR MINI MODULE EMI SHIELDING EVALUATION

BACKGROUND

1. Field

This disclosure relates generally to EMI shielding in integrated circuit device/packaging applications, and more specifically, to a method and apparatus for mini module EMI shielding evaluation.

2. Related Art

There are various factors that can influence the mini package/integrated shield/device/module RF (radio frequency) and EMI (electromagnetic interference) shielding effectiveness. A lot of work has been done on the rating of RF shielding effectiveness. Planar materials use plane-wave/far-field EM waves for evaluation. For mini package, device and module, RF shielding effectiveness evaluation is complex, and overall electromagnetic compatibility (EMC) is needed to be evaluated. There exists no industrial consensus on its evolution due to lack of proper testing system and methodology. Furthermore, functional modules are usually required to be used in such an RF shielding effectiveness evaluation.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 3 is a partial cross-sectional view of a portion of the test fixture including a shielding via wall, a conductive attachment feature, and a shield according to one embodiment of the present disclosure;

FIG. 4 is a partial cross-sectional view of a portion of the test fixture including a conductive feature and a shield according to another embodiment of the present disclosure;

FIG. 8 is a partial cross-sectional view of a portion of the test fixture including a mini emitter and a receiver arranged with respect to one another for carrying out transverse measurements according to one embodiment of the present disclosure;

FIG. 9 is a partial cross-sectional view of a portion of the test fixture including more than one mini emitter and a receiver arranged with respect to one another for carrying out both transverse and normal measurements according to another embodiment of the present disclosure;

DETAILED DESCRIPTION

According to one embodiment of the present disclosure, a method comprises evaluating the RF shielding effectiveness of mini package shields, devices and modules without using functional modules, to speed up development and reduce costs for the design process. The method is further for evaluating the RF shielding effectiveness of a package alone, or along with an application board (e.g., for application evaluation). In addition, a test fixture/test system is provided which is configurable for enabling the evaluation of RF shielding effectiveness for a variety of shields, devices and mini modules. As a result, an expensive and complex testing environment (e.g., using large, shielded chambers) is not required. The method and apparatus further improves test repeatability and accuracy. Moreover, the test vehicle for the testing system comprises a uniquely designed test vehicle according to the embodiments of the present disclosure.

As used herein, the phrase "very near field" shielding effectiveness measurements can be characterized as the distance between the emitter and receiver $r \ll \lambda/2\pi$, where $\lambda$ is the signal wave length; in some applications, physically within the distance of a few mini packages. In addition, as used herein, the phrase "near field" shielding effectiveness measurements can be characterized as the difference of the electrical coupling between the emitter and receiver (positioned within near field each other) with shield compared against without shield. Very near and near fields are not necessarily distinguishable and are also a function of wavelength rather than absolute distance.

Figure 1:
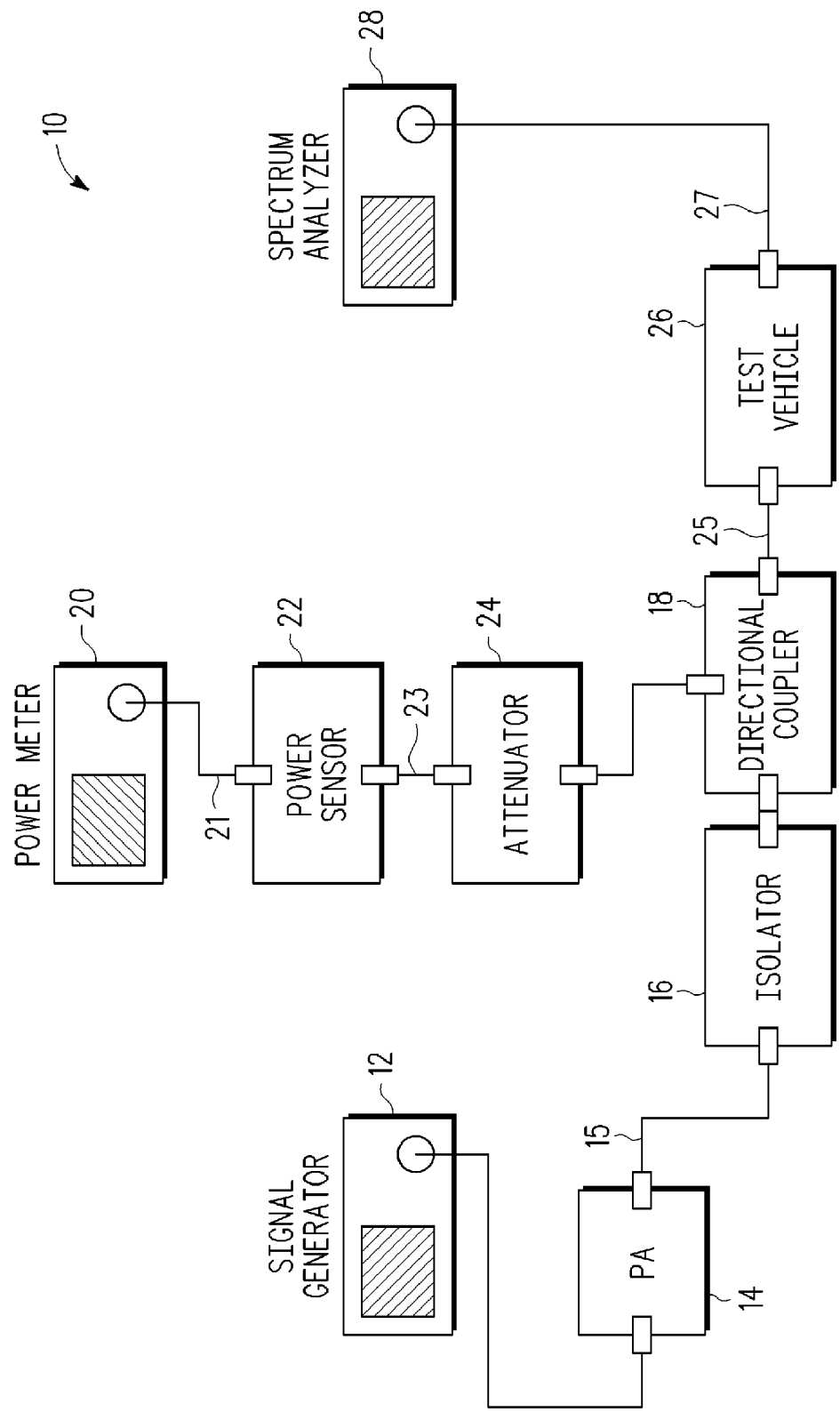
FIG. 1 is a block diagram representation of a shielding effectiveness testing system according to one embodiment of the present disclosure.

Referring now to FIG. 1, the shielding effectiveness testing system 10 includes a number of components. The components include a signal generator 12, a power amplifier (PA) 14, an isolator 16, and a directional coupler 18. The signal generator 12 provides output signals to an input of the PA 14, wherein the PA outputs an amplified signal on its output 15. The output of the PA is received by at the input of the isolator 16 and then into the directional coupler 18. The signal generator 12 is configured to generate desired testing signals for a given shielding effectiveness test, according to the embodiments of the present disclosure.

The testing system 10 further includes a power meter 20, a power sensor 22, and an attenuator 24. The attenuator input couples to an output of the directional coupler 18. An input 23 of the power sensor 22 couples to the output of the attenuator 24. Lastly, the power meter 20 input couples to the power sensor output 21. The power meter 20 is configured to monitor a power level at the output of the directional coupler 18 during a given shielding effectiveness test, according to the embodiments of the present disclosure.

The testing system 10 further includes a test vehicle 26 and a spectrum analyzer 28. The test vehicle 26 comprises a uniquely designed test vehicle and includes an input 25 and an output 27, as will be discussed further herein. The directional coupler 18, discussed above, is coupled to the input 25 of the test vehicle 26. The output 27 of the test vehicle 26 is coupled to an input of the spectrum analyzer 28. The spectrum analyzer 28 is configured to analyze a spectral output of the test vehicle 26 during a given shielding effectiveness test, in response to various test signals provided by the signal generator 12, via power amplifier 14, isolator 16, and directional coupler 18, according to the embodiments of the present disclosure.

According to one embodiment, a test fixture, vehicle and platform design includes features, for example, directed towards obtaining very near field measurements and near field measurements. The features (and/or steps) include assembly of (i) an emitter/receiver and (ii) reference/sample shields at the same time during fabrication for very near field and/or near field testing. In particular, the method includes using the same assembly process/conditions for all sample and reference shields fabricated at one time for a given mini module EMI shielding evaluation. As a result, the method advantageously provides for reducing alignment and positioning errors, which is especially important for very near field and near field testing. Alignment and positioning are incorporated within the fabrication process for the corresponding test fixture, vehicle, or platform design. In addition, the emitter and receiver can also include various designs to simulate an end-use application environment.

Furthermore, the test fixture can include a mini emitter, characterized as unidirectional and/or symmetrical, that is designed and fabricated into the test platform plane. For example, the test fixture can include a mini emitter and feeder. The feeder for the mini emitter comprises any suitable signal lines, and is configured for providing appropriate signals to the mini emitter for a given mini module EMI shielding evaluation. The test fixture may also include a mini reference receiver and feeder. The feeder for the mini receiver provides appropriate signal coupling to the mini receiver, further being configured for routing received signals to the spectrum analyzer, according to the requirements for a given mini module EMI shielding evaluation.

Figure 2:
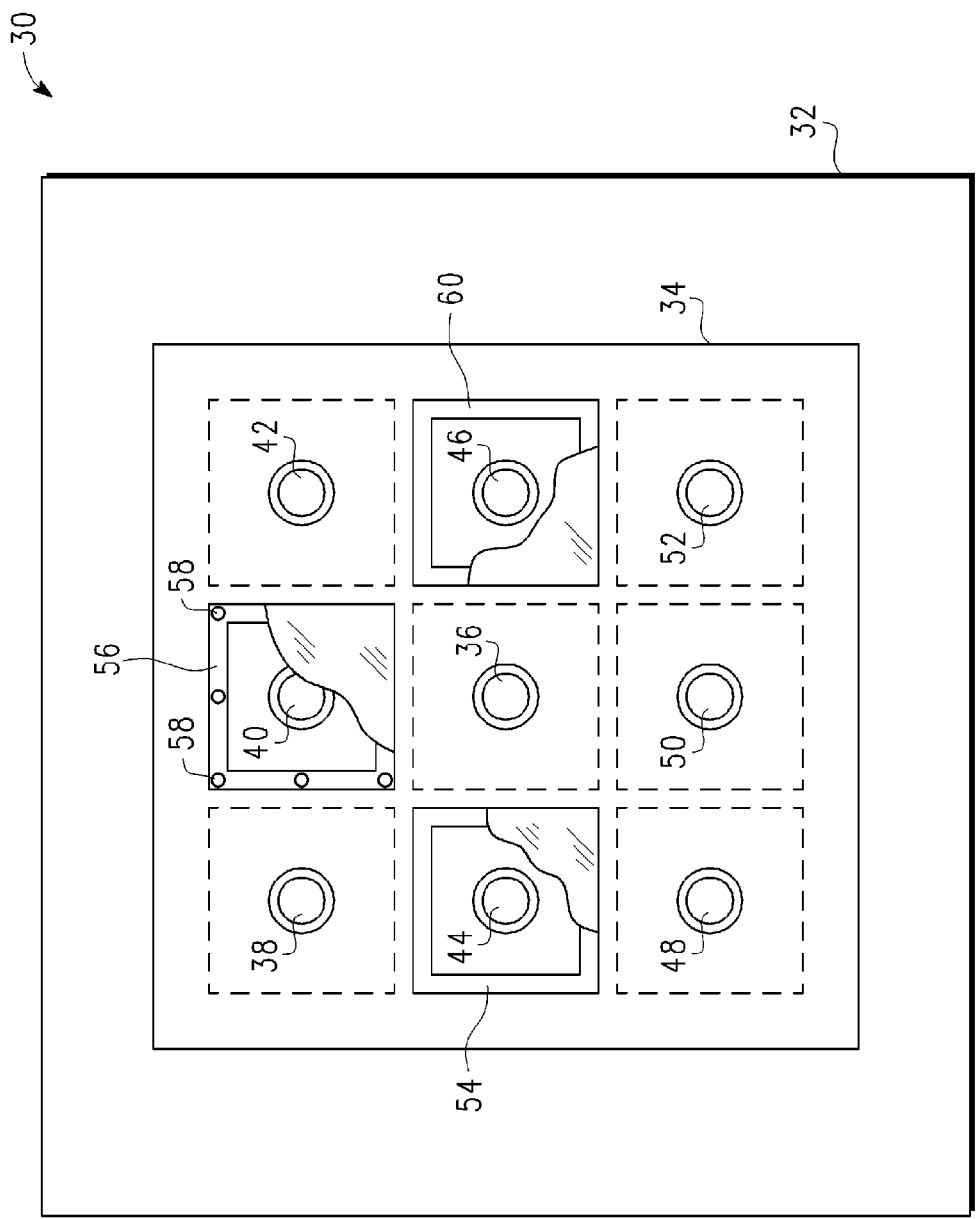
FIG. 2 is a top view of a test fixture for very near field measurements, with some features illustrated in a partial transparency view, according to one embodiment of the present disclosure.

FIG. 2 is a top view of a test fixture 30 suitable for very near field measurements, with some features illustrated in a partial transparency view, according to one embodiment of the present disclosure. In this embodiment, the test fixture 30 includes a conductive plate 32 having a dielectric substrate 34 overlying the conductive plate. A mini emitter 36 and its corresponding feeder (not shown) is positioned in a center of the dielectric substrate 34, wherein the feeder couples to the mini emitter from below the plane of the Figure. A plurality of mini receivers (38, 40, 42, 44, 46, 48, 50, and 52) is disposed about the mini emitter 36, for example, by a given radius or distance from the mini emitter. In one embodiment, the mini receivers comprise four receivers (40, 46, 50, and 44) that are disposed at an angle of zero (0), ninety (90), one-hundred eighty (180) and two-hundred and seventy (270) degrees, respectively, about the mini emitter 36. Further details of the mini emitter and the mini receivers will be discussed further herein below.

One mini receiver 50 includes no shield and is used as a mini reference receiver and feeder (not shown). Another mini receiver 44 includes a reference shield 54 overlying the corresponding mini receiver 44, as will be better understood from the additional description to follow with reference to FIG. 3. The reference shield 54 comprises a shield for which shielding characteristics are known or previously determined. Another mini receiver 40 can include a second reference shield 56 overlying the corresponding mini receiver 40, wherein the second reference shield 56 may or may not be the same type of shield as the first reference shield 54. As illustrated, the second reference shield 56 is attached to the underlying conductive plate 32 using a plurality of attachment pads 58, to be discussed further herein with reference to FIG. 3. The first and second reference shields are selected according to the requirements of a given test fixture and corresponding testing system implementation. Furthermore, a sample shield 60, corresponding to a shield under test for which an evaluation of shielding effectiveness is desired, is provided overlying another of the mini receivers, indicated by reference numeral 46, i.e., a mini receiver not already having a reference shield overlying the same.

In another embodiment, the mini receivers further comprise additional receivers (42, 52, 48 and 38) that are disposed, for example, at an angle of forty-five (45), one-hundred thirty-five (135), two-hundred twenty-five (225) and three-hundred and fifteen (315) degrees, respectively, about the mini emitter 36. In a further embodiment, the test fixture 30 may include still more mini receivers disposed, for example, in a grid arrangement, wherein the mini emitter 36 is generally located central to the plurality of mini receivers or grid of mini receivers.

FIG. 3 is a partial cross-sectional view of a portion 70 of a test fixture, for example, test fixture 30 of FIG. 2. Portion 70 comprises, for example, a mini receiver portion and includes a shielding via wall 72, a conductive attachment feature 74, and a reference shield 76 according to one embodiment of the present disclosure. In one embodiment, the test fixture/vehicle design includes for the reference shield 76 a metal platform 78, a dielectric 80 overlying the metal platform, an attachment ring 82 on a surface 84 of the dielectric 80, a conductive via wall 86 formed within the dielectric 80 and extending from the metal platform 78 on a bottom surface of the dielectric, through the dielectric, and to the attachment ring 82 on the top surface 84 of the dielectric 80. In one embodiment, the metal platform 78 includes a metal pedestal, characterized by a first base portion 88 having a first dimension, a second intermediate portion 90 overlying the first portion having a second dimension, and a third upper portion 92 having a third dimension. In one embodiment, the first, second, and third dimensions correspond to cross-sectional width dimensions, wherein the first width is less than the second width, which is less than the third width. Other dimensions, as well as an ordering smallest to largest, largest to smallest, or other ordering of the various widths, are also possible.

In one embodiment, the attachment ring 82 comprises a continuous ring configuration of conductive material that overlies surface 84 of dielectric 80. In one embodiment, the continuous ring configuration follows a corresponding surface contact shape of an overlying shield yet to formed and/or placed upon the attachment ring. In another embodiment, the attachment ring 82 comprises an array of conductive attachment pads collectively disposed in a ring configuration overlying surface 84 of dielectric 80. The ring configuration array of conductive attachment pads follows a corresponding surface contact shape of an overlying shield yet to formed and/or placed upon the attachment ring.

In addition, in one embodiment, the via wall $86_1$ comprises a single via wall (as is illustrated in the right-hand side of FIG. 3). The via wall $86_1$ includes a configuration which follows the configuration of the continuous ring of attachment ring 82. In another embodiment, the via wall $86_2$ comprises a double via wall (as is illustrated in the left-hand side of FIG. 3), wherein the double via wall includes a first via wall and a second via wall separated from one another along a vertical dimension thereof by dielectric. Both embodiments of the via wall 86 ($86_1$ and $86_2$) are illustrated in FIG. 3 for simplicity of illustration; however, one or the other embodiment would be implemented for a given field measurement evaluation. In a still further embodiment, the via wall 86 may comprise a collective plurality of via walls.

In addition, a mini receiver 94 is disposed within a first dielectric 96 (which may be different from the dielectric 80 overlying the metal platform 78) in a central location within portion 70 of a given test fixture/vehicle design. In one embodiment, the first dielectric 96 is disposed within an opening of the metal platform 78 and a second dielectric forms the dielectric 80 overlying the metal platform. The second dielectric includes an opening (such as is generally indicated by reference numeral 98), wherein a portion of the second dielectric 80 and the opening 98 in the second dielectric overlies the first dielectric 96. A portion of the mini receiver 94 extends through the first dielectric 96 and through the opening 98 in the second dielectric 80, and further wherein a portion also extends above surface 84. Lastly, feed lines, for carrying signals from mini receiver 94 are generally represented by arrows 100. Feed lines 100 comprise any suitable signal lines.

A reference shield 76 is attached to the conductive attachment feature 74 (whether an attachment ring or attachment pads) depending upon the given type of attachment that is implemented for a given shielding effectiveness testing application. The shielding via 72 and attachment feature 74 (ring or pads) advantageously provide for eliminating of undesired electromagnetic interference coupling for the reference shield 76.

While not explicitly shown, the cross-sectional configuration for an emitter portion of the test fixture such as emitter 36 of test fixture 30 of FIG. 2 can be similar to the mini receiver portion 70 of FIG. 3, with the exception that the mini receiver 94 would be replaced by a mini emitter 36 and which could include at least a shield 76 or no shield, according to the requirements of a given EMI testing and/or evaluation implementation.

FIG. 4 is a partial cross-sectional view of a portion 102 a test fixture, for example, test fixture 30 of FIG. 3, according to another embodiment of the present disclosure. Portion 102 comprises, for example, a mini receiver portion. The mini receiver portion 102 includes a conductive feature 104 and a shield 106. Shield 106 comprises, for example, a shield under test. The portion 102 of the test fixture/vehicle design further includes, in conjunction with the shield under test, a metal platform 108, wherein the conductive feature 104 comprises a metal coupon overlying the metal platform. In one embodiment, portion 102 of the test fixture/vehicle design further includes an attachment ring (not shown) on a surface of the metal coupon 104, similar to the attachment ring 82 discussed herein above with reference to the portion 70 of FIG. 3. In addition, similar to that discussed above with respect to portion 70 of FIG. 3, the attachment ring (not shown in FIG. 4) can comprise a continuous ring of conductive material or an array of conductive attachment pads collectively disposed in a ring configuration. In one embodiment, the metal platform 108 includes a metal pedestal, characterized by a first base portion 110 having a first dimension, a second intermediate portion 112 overlying the first portion having a second dimension, and a third upper portion 114 having a third dimension. In one embodiment, the first, second, and third dimensions correspond to cross-sectional width dimensions, wherein the first width is less than the second width, which is less than the third width. Other dimensions, as well as an ordering smallest to largest, largest to smallest, or other ordering of the various widths, are also possible.

In addition, a mini receiver 116 is disposed within a dielectric 118 in a central location in a central location within portion 102 of a given test fixture/vehicle design. In one embodiment, the dielectric 118 is disposed within an opening of the metal platform 108. The metal coupon 104 includes an opening, generally indicated by reference numeral 120, wherein a portion of the metal coupon and the opening in the metal coupon overlies the dielectric 118. A portion of the mini receiver 116 extends through the dielectric 118 and through the opening 120 in the metal coupon 104, and further wherein a portion also extends above surface of coupon 104. Lastly, feed lines, for carrying signals from mini receiver 116 are generally represented by arrows 122. Feed lines 122 comprise any suitable signal lines.

A shield under test 106 is attached to the metal coupon 104, for example, using a suitable attachment ring, attachment pads, or other suitable technique, depending upon the given type that is implemented for a given shielding effectiveness testing application. The shield under test 106 may also be attached directly to the surface of the metal coupon 104. The shielding attachment feature (ring or pads) advantageously provides for simulating a real world application environment for the shield under test. In addition, the EMI performance of the reference shield, as discussed herein above, is at least one order of magnitude higher than the EMI performance of the shield under test. In one embodiment, the shield under test 106 can comprise a metallic shield. The shape and x-y-z directions of the shield under test will be dictated by the specific module or package size/shape to be evaluated. Shield thickness can range from several microns to hundreds of microns. In addition, the shield under test can comprise a stand alone shield or be a shield under test that is attached to an actual package (containing mold compounds, substrate, die, etc.). In the embodiment of using an actual package, a cavity is created within the package, and more particularly, within the space of the corresponding shield, where an antenna is placed and located for obtaining shielding effectiveness measurements.

Figure 5:
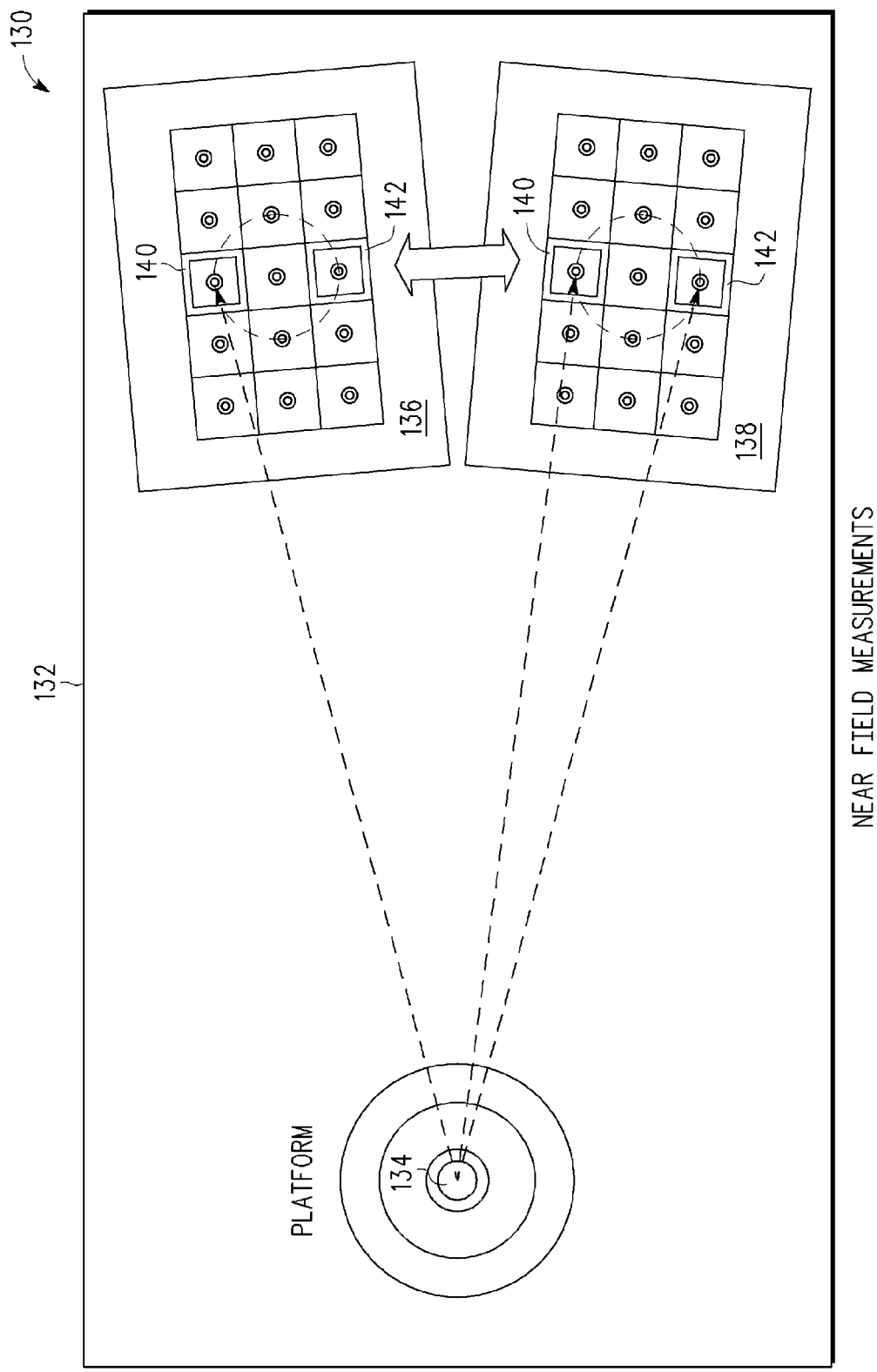
FIG. 5 is a top view of a test fixture for near field measurements, with some features illustrated in a partial transparency view, according to another embodiment of the present disclosure.

FIG. 5 is a top view of a test fixture 130 for near field measurements, with some features illustrated in a partial transparency view, according to another embodiment of the present disclosure. In the embodiment of FIG. 5, mini emitter portions and mini receiver portions thereof are similar to those discussed herein above with respect to the embodiments of FIGS. 2-4, with the following differences. The test fixture 130 includes a platform 132 configured to simulate appropriate application board conditions of a corresponding implementation. For example, an emitter 134 is disposed on a platform along with one or more sub-test fixtures (136, 138), wherein each sub-test fixture includes at least one reference shield 140 and one sample shield 142 (i.e., shield under test). In addition, at least one of the test fixtures includes a reference shield which may have a conductive platform and at least one of the test fixtures includes a reference shield which may have a non-conductive platform. Accordingly, various types of platforms are contemplated: conductive and/or non-conductive. Furthermore, additional test fixtures can be placed at varied distances from the emitter 134. For example, a plurality of test fixtures can be positioned about the emitter, wherein a distance from a first test fixture to the emitter and a distance from a second test fixture to the emitter can comprise similar distances or different distances, wherein the particular distances are selected according to the requirements of the given shielding effectiveness application. Furthermore, the shield under test and the reference shield are preferably fabricated and/or assembled concurrently, during the same process of fabrication of platform 132. Doing so advantageously eliminates any contribution of assembly to subsequent shielding effectiveness measurements. Also, the configuration of platform 132 of FIG. 5 is useful for side-by-side shielding effectiveness measurements, wherein the configuration advantageously eliminates reproducibility errors in the shielding effectiveness measurements.

Figure 6:
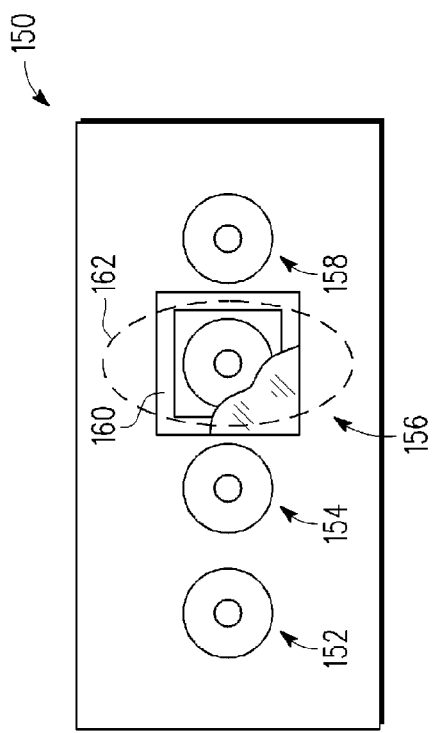
FIG. 6 is a top view of a mini emitter and receiver co-designed into a single fixture, with some features illustrates in partial transparency view, according to one embodiment of the present disclosure.

FIG. 6 is a top view of a mini emitter and receiver co-designed into a single fixture 150, with some features illustrates in partial transparency view, according to one embodiment of the present disclosure. In the embodiment of FIG. 6, mini emitter portions and mini receiver portions thereof are similar to those discussed herein above with respect to the embodiments of FIGS. 2-4, with the following differences. The mini emitter and receiver portions (such as generally indicated by reference numerals 152, 154, 156, and 158) can comprise different types and/or simulated real world circuits/applications. Fixture 150 is preferably co-designed with the corresponding emitter/receiver portions thereof. In addition, the corresponding attachment for the shield under test (such as generally indicated by reference numeral 160) is designed and completed to simulate a real world application. Furthermore, the shield under test may include shapes other than rectilinear shapes, for example, such as an elliptical shape as indicated by reference numeral 162. In addition, any shield under test and/or reference shield of fixture 150 are preferably fabricated and/or assembled concurrently, during the same process of fabrication of the fixture 150. Doing so advantageously eliminates reproducibility errors in the shielding measurements. Furthermore, the configuration of fixture 150 of FIG. 6 removes any contribution of the setup and assembly on the repeatability of the actual shielding effectiveness measurements. While fixture 150 has been illustrated with three emitter portions and one shielding portion, other combinations of emitter portions and shielding portions are also contemplated.

Figure 7:
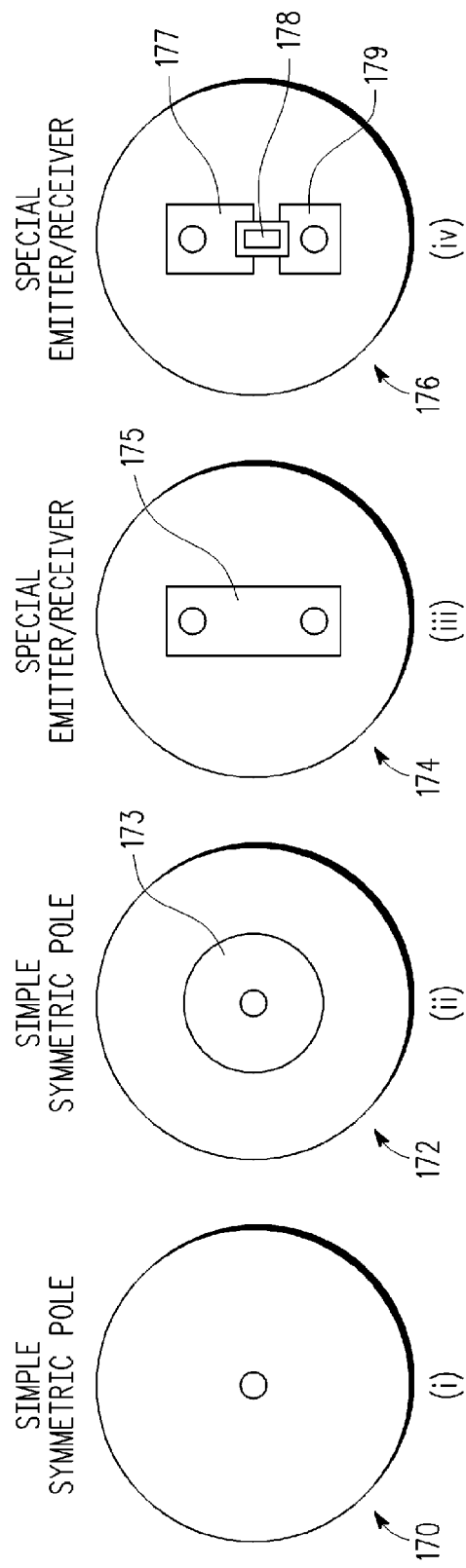
FIG. 7 is a top view several different variations of the mini emitter and/or receiver of a test fixture, according to one embodiment of the present disclosure.

FIG. 7 is a top view several different variations of the mini emitter and/or receiver portions of a test fixture, according to one embodiment of the present disclosure. In the embodiment of FIG. 7, mini emitter portions and mini receiver portions thereof are similar to those discussed herein above with respect to the embodiments of FIGS. 2-4, with differences as noted herein. In particular, examples of emitter/receiver design include a single symmetric pole for one or both of the emitter and receiver (generally indicated by reference numeral 170) disposed within a dielectric; a simple symmetric patch for one or both of the emitter and receiver (generally indicated by reference numeral 172) wherein the patch 173 is conductive and disposed within and/or overlying a dielectric; an emitter/receiver (generally indicated by reference numeral 174) having a conductive strip 175 within and/or overlying a dielectric, the conductive strip 175 being grounded at one end of the strip; and an emitter/receiver (generally indicated by reference numeral 176) having a corresponding first strip 177 acting as a transmission line, which is connected to a resistive element 178 which is then connected to ground via 179. The different designs allow for simulation of an actual application environment or environments.

FIG. 8 is a partial cross-sectional view of a portion 180 of the test fixture including a mini emitter and a receiver arranged with respect to one another for carrying out transverse shielding effectiveness measurements according to one embodiment of the present disclosure. In the embodiment of FIG. 8, mini emitter portions and mini receiver portions thereof are similar to those discussed herein above with respect to the embodiments of FIGS. 2-7, with differences as noted herein. In particular, the testing system can be arranged for implementing one or more of (i) transverse measurements and (ii) transverse and normal measurements. For transverse measurements alone, a supporter/EMI case can be open or enclosed, and conductive or non-conductive. In addition, at least one emitter/receiver portions is disposed transverse or adjacent to the shield under test. In the embodiment as illustrated in FIG. 8, the configuration of the case (collectively referred to by reference numeral 182) can simulate an application environment. The housing/casing 182 comprises a perimeter piece 184 and a top cap 186. Either piece (184, 186) can be conductive or non-conductive depending upon the application to be simulated. Portion 180 of the testing fixture further includes an emitter portion (generally indicated by reference numeral 188) and a receiver portion (generally indicated by reference numeral 190, wherein the receiver portion includes a shield under test 192. The emitter portion 188 and the receiver portion 190 are disposed transverse to one another on platform 194. Transverse measurements refer to side-by-side measurements, as opposed to face-to-face or directly normal orientation measurements. Transverse measurements are useful, for example, in testing and evaluating the sidewalls of the shield under test.

FIG. 9 is a partial cross-sectional view of a portion 200 of the test fixture including more than one mini emitter and a receiver arranged with respect to one another for carrying out both transverse and normal measurements according to another embodiment of the present disclosure. In the embodiment of FIG. 9, mini emitter portions and mini receiver portions thereof are similar to those discussed herein above with respect to the embodiments of FIGS. 2-8, with differences as noted herein. For transverse and normal measurements, a supporter/EMI case is open or enclosed, and conductive or non-conductive. In addition, in the later instance, at least one emitter/receiver is disposed transverse or adjacent to the shield under test, and at least one emitter/receiver is disposed normal to the shield under test. In the embodiment as illustrated in FIG. 9, the configuration of the case (collectively referred to by reference numeral 202) can simulate another application environment. In FIG. 9, the housing/casing 202 comprises a perimeter piece 204 and a top cap 206. Either piece (202,204) can be conductive or non-conductive depending upon the application to be simulated. In particular, the top cap 206 comprises a testing platform which can include additional emitter patches 208 and 210, for example, as discussed herein with reference to FIG. 7, and additional packages and shields under test (not shown). In the arrangement of FIG. 9, transverse shielding effectiveness measurements as well as normal direction shielding effectiveness measurements can be performed simultaneously.

According to various embodiments as discussed herein, the method includes assembling emitter/receiver and reference/sample shields concurrently, at the same time, and/or on a same test fixture for very-near and near field testing using the same assembly process/conditions for all sample and reference shields. As a result, this advantageously reduces alignment and positioning errors, especially for very-near field testing. In addition, the emitter and receiver design can include variations from the embodiments as illustrated herein. Shielding via and attachment ring/pads are designed and included to eliminate the undesired coupling and/or to simulate the real environment. In addition, a metal coupon/ring can be used for attachment, especially for shield only evaluations. Furthermore, non-conductive or conductive test case and/or test setups can be used to simulate a real world application.

The embodiments of the present disclosure advantageously provide for minimizing alignment and positioning errors, thereby improving upon testing consistency, especially for very-near field measurements associated with mini-modules. The method of the present disclosure also advantageously allows for different emitter and receiver designs. Furthermore, shielding via and attachment ring/pads are designed and included to eliminate the undesired coupling and/or to simulate the real environment. The embodiments of the present disclosure are suitable for a wide range of modules, whereby a functional module for end product use, is not required, which further reduces both development time and costs. Still further, the system can be used for EMI evaluation for integrated circuit device packages alone, or in combination and along with an application board.

The method and apparatus according to the embodiments of the present disclosure can be used in the design and development process for any product that is EMI sensitive. Examples include, but are not limited to, RF modules, microwave modules, millimeter wave modules, digital chip modules, and optical modules.

The systems and methods according to the embodiments of the present disclosure advantageously provide for low cost and quick-turn around mini module EMI shielding effectiveness evaluation. While EMI shielding effectiveness evaluation can still be performed with a functional module, the same is not absolutely required for performing the EMI shielding effectiveness evaluation. In addition, the embodiments provide additional advantage in that the embodiments help to address the EMI shielding needs at the component level to meet a specific request or end-user implementation. Lastly, EMI shielding is very important in wireless device technology and industry.

Figure 10:
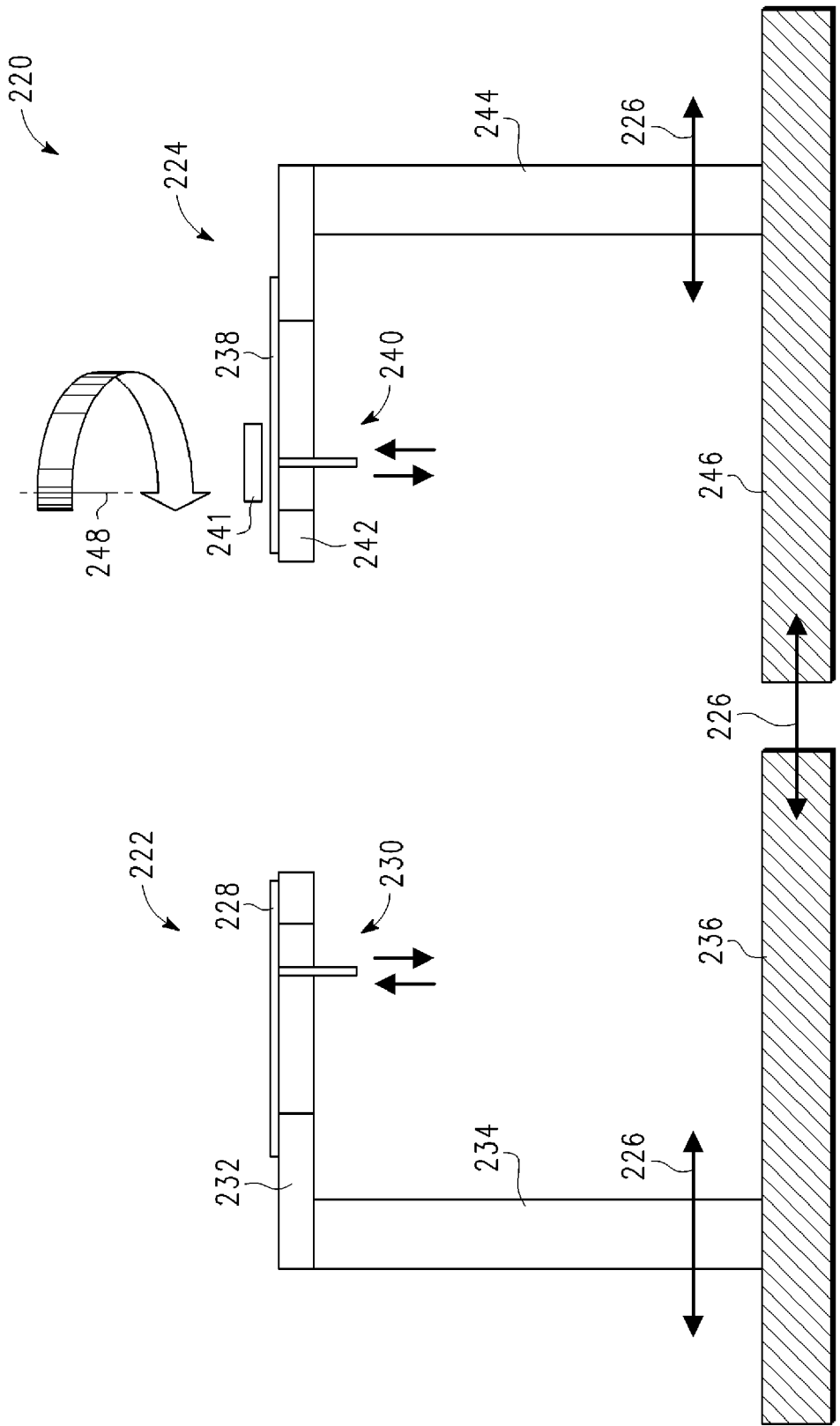
FIG. 10 is a partial cross-sectional view of a portion of a test vehicle/testing system setup including a first test fixture without a shield and a second test fixture with a reference/sample shield, the first test fixture and second test fixture being spaced apart from one another in a horizontal orientation for a given reference/sample shield test according to one embodiment of the present disclosure.

FIG. 10 is a partial cross-sectional view of a portion 220 of a test vehicle/testing system setup including a first test fixture 222 without a shield and a second test fixture 224 with a reference/sample shield, the first test fixture and second test fixture being spaced apart from one another in a horizontal orientation (as indicated by the arrows 226) for a given reference/sample shield test according to one embodiment of the present disclosure. In the embodiment of FIG. 10, mini emitter portions and mini receiver portions thereof are similar to those discussed herein above with respect to the embodiments of FIG. 2-9, with differences as noted herein. For example, first test fixture 222 includes a platform 228 having an emitter portion 230. The first test fixture 222 further includes a support arm having an upper support arm portion 232, a lower support arm portion 234, and a support base 236, wherein the upper support arm portion 232 couples to the lower arm portion 234, the lower support arm portion 234 couples to the support base 236. The upper support arm portion 232 is configurable between a horizontal position and a vertical position to orient a corresponding test fixture between the horizontal position and the vertical position. As illustrated in FIG. 10, the upper support arm portion 232 is in a horizontal position.

In addition, second test fixture 224 includes a platform 228 having a receiver portion 240, wherein the receiver portion includes a shield under test 241. The second test fixture 224 further includes a support arm having an upper support arm portion 242, a lower support arm portion 244, and a support base 246, wherein the upper support arm portion 242 couples to the lower arm portion 244, the lower support arm portion 244 couples to the support base 246. The upper support arm portion 242 is configurable between a horizontal position and a vertical position to orient a corresponding test fixture between the horizontal position and the vertical position. As illustrated in FIG. 10, the upper support arm portion 242 is in a horizontal position. In addition, test fixture 224 is adapted to be positioned about an axis perpendicular to a surface of the upper support arm 242 portion of the support arm, as generally indicated by reference numeral 248. Furthermore, with respect to the support arms of the first test fixture 222 and the second test fixture 224, the support arm can comprise conductive and/or non-conductive materials. In one embodiment, the upper support arm portion 242 of the second test fixture 224 is configured in a horizontal position and further adapted to be positioned about a vertical axis 248. Accordingly, the configuration of FIG. 10 advantageously allows for the adjustment of spacing between various testing platforms and/or fixtures for performing transverse orientation shielding effectiveness measurements, for example, wherein one or more of the testing platforms could include test fixture 150 as discussed herein with reference to FIG. 6.

Figure 11:
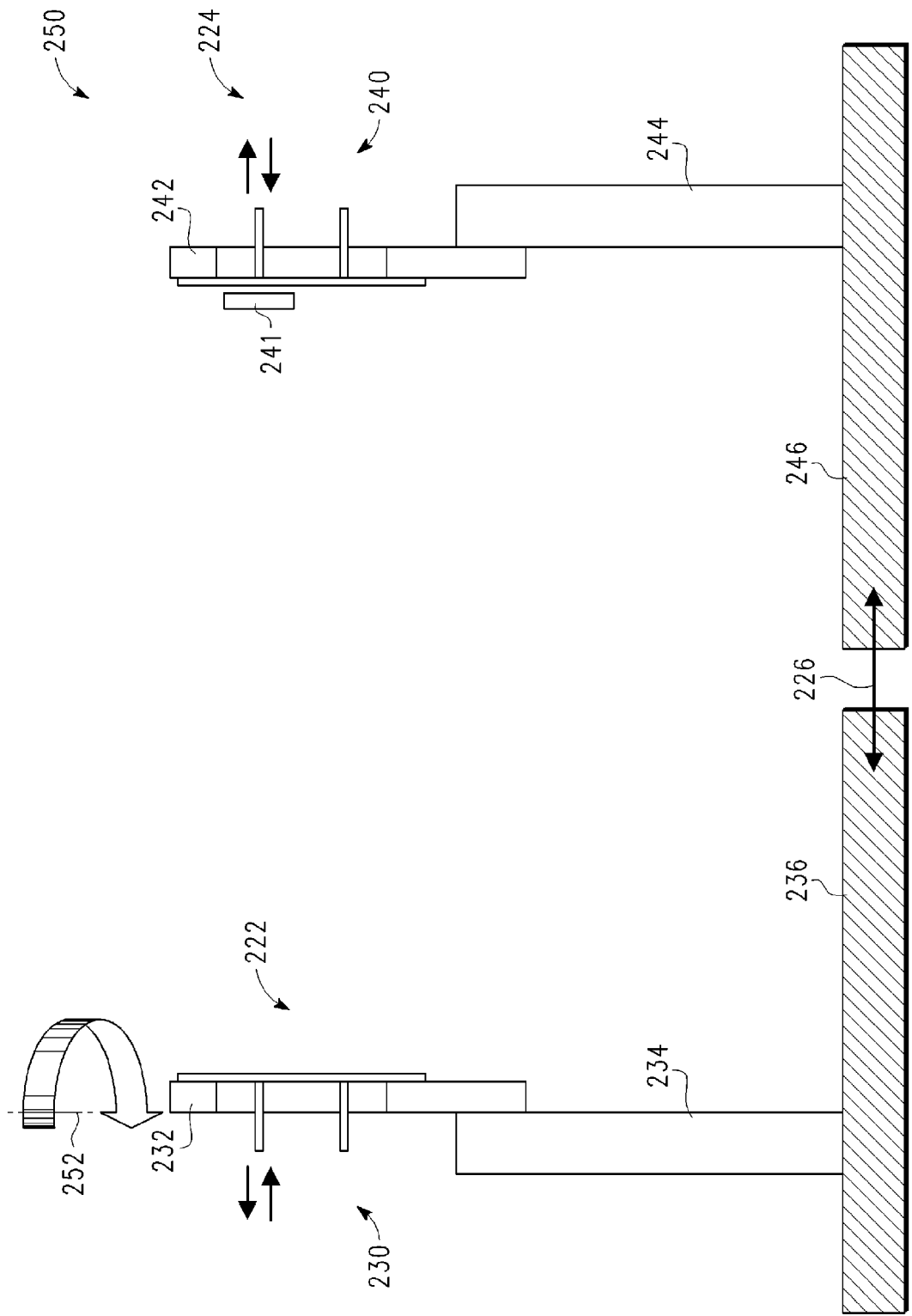
FIG. 11 is a partial cross-sectional view of a portion of a test vehicle/testing system setup including a first test fixture without a shield and a second test fixture with a reference/sample shield, the first test fixture and second test fixture being spaced apart from one another in a vertical orientation for a given reference/sample shield test according to another embodiment of the present disclosure.

FIG. 11 is a partial cross-sectional view of a portion 250 of a test vehicle/testing system setup including a first test fixture 222 without a shield and a second test fixture 224 with a reference/sample shield, the first test fixture and second test fixture being spaced apart from one another in a vertical orientation for a given reference/sample shield test according to another embodiment of the present disclosure. In the embodiment of FIG. 11, mini emitter portions and mini receiver portions thereof are similar to those discussed herein above with respect to the embodiments of FIGS. 2-10, with differences as noted herein. In one embodiment, the upper support arm portion 232 of the first test fixture 222 is configured in a vertical position and further adapted to be positioned about a vertical axis 252. In addition, as illustrated in FIG. 11, the upper support arm portion 242 of test fixture 224 is in a vertical position. The configuration of FIG. 11 advantageously allows for the adjustment of spacing between various testing platforms and/or fixtures for performing normal orientation shielding effectiveness measurements, for example, wherein one or more of the testing platforms could include test fixture 150 as discussed herein with reference to FIG. 6.

By now it should be appreciated that there has been provided a method for mini module EMI shielding effectiveness evaluation comprises: providing a test vehicle including at least one test platform, the test platform having at least one mini emitter, a mini receiver with a reference shield, and a mini receiver with a shield under test; applying shielding effectiveness transmission signals to the at least one mini emitter; and evaluating signals received by the mini receiver with a shield under test and the mini receiver with the reference shield, wherein the at least one (i) mini emitter, (ii) mini receiver with the reference shield, and (iii) mini receiver with the shield under test comprise components fabricated concurrently and under fabrication conditions used for fabrication of the at least one test platform of the at least one test vehicle. Note that in another embodiment, the mini emitter may also be used as a mini receiver, the mini receiver with reference shield may also be used as a mini emitter with reference shield, and the mini receiver with the shield under test may also be used as a mini emitter with the shield under test, according to the requirements of a given EMI testing and/or evaluation implementation.

In one embodiment, the test vehicle comprises a first test platform coupled to a first test fixture and a second test platform coupled to a second test fixture, the method for mini module shielding effectiveness evaluation further comprising: changing a position of the first test fixture with respect to a position of the second test fixture. According to another embodiment, the mini emitter/receiver with or without a shield comprises an EMI sensitive component selected from the group consisting of an RF component, a microwave component, a millimeter wave component, a digital chip component, and an optical module component.

In another embodiment, for EMI shielding effectiveness corresponding to very near field measurements, the test platform comprises a conductive plate, a dielectric disposed overlying a portion of the conductive plate, a mini emitter, at least two mini receivers, a reference shield overlying one of the at least two mini receivers, and a shield under test overlying another of the at least two mini receivers. The mini emitter is disposed within the test platform and positioned in a central location with respect to the at least two mini receivers, further wherein the at least two mini receivers comprise at least three mini receivers, the test platform further comprising a second reference shield overlying a mini receiver of the at least three mini receivers not covered by either one of the reference shield or the shield under test, still further wherein one of the at least three mini receivers is configured as a non-shielded mini reference receiver. In another embodiment, the at least two mini receivers comprise eight mini receivers, the mini receivers being collectively arranged in a square configuration, one mini receiver located at a midpoint of each side and one mini receiver located at each corner of the square configuration, further wherein the mini emitter is located within and at the center of the square configuration.

In a further embodiment, for EMI shielding effectiveness corresponding to near field measurements, the test platform comprises (i) an emitter portion and (ii) at least one receiver portion, wherein the emitter portion comprises a first conductive plate, a dielectric disposed overlying a portion of the conductive plate, and a mini emitter, and wherein the receiver portion comprises a second conductive plate, a dielectric disposed overlying a portion of the conductive plate, at least two mini receivers, a reference shield overlying one of the at least two mini receivers, and a shield under test overlying another of the at least two mini receivers. In another embodiment, the emitter portion and the at least one receiver portion are positioned with respect to one another on a common platform, wherein the positioning of the emitter and receiver portions on the common platform simulates one or more operating condition of an EMI sensitive application, wherein the common platform comprises one of a conductive platform and a non-conductive platform. In a still further embodiment, the test platform further comprises (iii) at least one additional receiver portion, wherein the at least one additional receiver portion comprises a conductive plate, a dielectric disposed overlying a portion of the conductive plate, at least two mini receivers, a reference shield overlying one of the at least two mini receivers, and a shield under test overlying another of the at least two mini receivers, wherein the at least one additional receiver portion is also positioned with respect to the emitter portion on the common platform, wherein the positioning of the emitter portion and the at least one additional receiver portion on the common platform simulates one or more operating condition of the EMI sensitive application.

In another embodiment, each mini receiver comprises a metal layer having an opening formed within the metal layer, a dielectric disposed within the opening, and a receiver antenna extending through the dielectric within the opening. The mini receiver with the reference shield further comprises a second dielectric overlying the metal layer and a portion of the dielectric disposed within the opening of the metal layer, wherein the second dielectric includes an opening in the region of the receiver antenna, wherein the receiver antenna extends through the opening in the second dielectric, and the mini receiver with the reference shield further comprises a via wall, the via wall extending from a top surface of the second dielectric, through the second dielectric, and in contact with the metal layer, the via wall further being disposed along a predefined perimeter about the receiver antenna, and a shield coupled to the via wall through a conductive attachment feature. The conductive attachment feature comprises at least one selected from the group consisting of a conductive attachment ring, a conductive attachment band, and a plurality of conductive attachment pads, and still further the via wall comprises one selected from a single via wall and a double via wall.

In another embodiment, the mini receiver with the shield under test further comprises a conductive feature overlying the metal layer and a portion of the dielectric disposed within the opening of the metal layer, wherein the conductive feature includes an opening in the region of the receiver antenna, wherein the receiver antenna extends through the opening in the conductive feature, and wherein the shield under test couples to the receiver and is attached to the conductive feature, and further wherein the conductive feature comprises at least one selected from the group consisting of a conductive coupon, a conductive band, and a conductive ring.

In a further embodiment, the mini emitter and the mini receiver with the shield under test are of different types, the different types having been chosen to simulate at least one selected from a given EMI sensitive circuit and a given EMI sensitive circuit application. At least one of the mini emitter and the mini receiver with the shield under test comprises a design for simulating an EMI sensitive circuit application. Still further, the design includes at least one selected from the group consisting of (i) a single symmetric pole for one or both of the mini emitter and mini receiver disposed within a dielectric, (ii) a simple symmetric patch for one or both of the mini emitter and mini receiver wherein the symmetric patch is conductive and disposed overlying a dielectric, (iii) an emitter/receiver having a conductive strip overlying a dielectric, the conductive strip being grounded at one end of the strip, and (iv) an emitter/receiver having a corresponding first strip acting as a transmission line, which is connected to a resistive element which is then connected to a ground via.

In another embodiment, the mini emitter and the mini receiver with the shield under test are arranged with respect to one another for carrying out transverse shielding effectiveness measurements. The mini emitter and the mini receiver with the shield under test can also comprise a plurality of mini emitters and a single mini receiver arranged with respect to each other for carrying out both transverse and normal shielding effectiveness measurements.

According to another embodiment, a method for mini module EMI shielding effectiveness evaluation comprises: providing a test vehicle including at least one test platform, the test platform having at least one mini emitter, a mini receiver with a reference shield, and a mini receiver with a shield under test; applying shielding effectiveness transmission signals to the at least one mini emitter; and evaluating signals received by the mini receiver with a shield under test and the mini receiver with the reference shield, wherein the at least one (i) mini emitter, (ii) mini receiver with the reference shield, and (iii) mini receiver with the shield under test comprise components fabricated concurrently and under fabrication conditions used for fabrication of the at least one test platform of the at least one test vehicle, wherein each mini receiver comprises a metal layer having an opening formed within the metal layer, a dielectric disposed within the opening, and a receiver antenna extending through the dielectric within the opening, wherein the mini receiver with the reference shield further comprises a second dielectric overlying the metal layer and a portion of the dielectric disposed within the opening of the metal layer, wherein the second dielectric includes an opening in the region of the receiver antenna, wherein the receiver antenna extends through the opening in the second dielectric, and wherein the mini receiver with the reference shield further comprises at least one via wall, the via wall extending from a top surface of the second dielectric, through the second dielectric, and in contact with the metal layer, the via wall further being disposed along a predefined perimeter about the receiver antenna, and a shield coupled to the via wall through a conductive attachment feature, further wherein the conductive attachment feature comprises at least one selected from the group consisting of a conductive attachment ring, a conductive attachment band, and a plurality of conductive attachment pads, and wherein the mini receiver with the shield under test further comprises a conductive feature overlying the metal layer and a portion of the dielectric disposed within the opening of the metal layer, wherein the conductive feature includes an opening in the region of the receiver antenna, wherein the receiver antenna extends through the opening in the conductive feature, and wherein the shield under test couples to the conductive feature, and further wherein the conductive feature comprises at least one selected from the group consisting of a conductive coupon, a conductive band, and a conductive ring.

In a further embodiment, an apparatus for mini module EMI shielding effectiveness evaluation comprises: a test vehicle including at least one test platform, the test platform having at least one mini emitter, a mini receiver with a reference shield, and a mini receiver with a shield under test; means for applying shielding effectiveness transmission signals to the at least one mini emitter; and means for evaluating signals received by the mini receiver with a shield under test and the mini receiver with the reference shield, wherein the at least one (i) mini emitter, (ii) mini receiver with the reference shield, and (iii) mini receiver with the shield under test comprise components fabricated concurrently and under fabrication conditions used for fabrication of the at least one test platform of the at least one test vehicle, wherein each mini receiver comprises a metal layer having an opening formed within the metal layer, a dielectric disposed within the opening, and a receiver antenna extending through the dielectric within the opening, wherein the mini receiver with the reference shield further comprises a second dielectric overlying the metal layer and a portion of the dielectric disposed within the opening of the metal layer, wherein the second dielectric includes an opening in the region of the receiver antenna, wherein the receiver antenna extends through the opening in the second dielectric, and wherein the mini receiver with the reference shield further comprises at least one via wall, the via wall extending from a top surface of the second dielectric, through the second dielectric, and in contact with the metal layer, the via wall further being disposed along a predefined perimeter about the receiver antenna, and a shield coupled to the via wall through a conductive attachment feature, further wherein the conductive attachment feature comprises at least one selected from the group consisting of a conductive attachment ring, a conductive attachment band, and a plurality of conductive attachment pads, and wherein the mini receiver with the shield under test further comprises a conductive feature overlying the metal layer and a portion of the dielectric disposed within the opening of the metal layer, wherein the conductive feature includes an opening in the region of the receiver antenna, wherein the receiver antenna extends through the opening in the conductive feature, and wherein the shield under test couples to the conductive feature, and further wherein the conductive feature comprises at least one selected from the group consisting of a conductive coupon, a conductive band, and a conductive ring.

Because the apparatus implementing the present invention is, for the most part, composed of electronic components and circuits known to those skilled in the art, specific details have not been explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the embodiments of the present disclosure can be used for a design and development process for any product that is EMI sensitive, which can include, but not be limited to: RF, microwave, millimeter wave, digital chip, optical modules, etc. In addition, as used herein, a mini emitter and mini receiver may be interchanged according to the requirements of a given EMI shielding effectiveness evaluation. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for mini module EMI shielding effectiveness evaluation comprising:
   providing a test vehicle including at least one test platform, the test platform having at least one mini emitter, a mini receiver with a reference shield, and a mini receiver with a shield under test;
   applying shielding effectiveness transmission signals to the at least one mini emitter; and evaluating signals received by the mini receiver with a shield under test and the mini receiver with the reference shield, wherein the at least one (i) mini emitter, (ii) mini receiver with the reference shield, and (iii) mini receiver with the shield under test comprise fabricated components fabricated concurrently and under fabrication conditions used for fabrication of the at least one test platform of the at least one test vehicle.

2. The method of claim 1, wherein the test vehicle comprises a first test platform coupled to a first test fixture and a second test platform coupled to a second test fixture, the method for mini module shielding effectiveness evaluation further comprising:

changing a position of the first test fixture with respect to a position of the second test fixture.

3. The method of claim 1, wherein the mini receiver with the reference shield comprises an EMI sensitive component selected from the group consisting of an RF component, a microwave component, a millimeter wave component, a digital chip component, and an optical module component.

4. The method of claim 1, wherein for EMI shielding effectiveness corresponding to very near field measurements, the test platform comprises a conductive plate, a dielectric disposed overlying a portion of the conductive plate, a mini emitter, at least two mini receivers, a reference shield overlying one of the at least two mini receivers, and a shield under test overlying another of the at least two mini receivers.

5. The method of claim 4, wherein the mini emitter is disposed within the test platform and positioned in a central location with respect to the at least two mini receivers, further wherein the at least two mini receivers comprise at least three mini receivers, the test platform further comprising a second reference shield overlying a mini receiver of the at least three mini receivers not covered by either one of the reference shield or the shield under test, still further wherein one of the at least three mini receivers is configured as a non-shielded mini reference receiver.

6. The method of claim 5, wherein the at least two mini receivers comprise eight mini receivers, the mini receivers being collectively arranged in a square configuration, one mini receiver located at a midpoint of each side and one mini receiver located at each corner of the square configuration, further wherein the mini emitter is located within and at the center of the square configuration.

7. The method of claim 1, wherein for EMI shielding effectiveness corresponding to near field measurements, the test platform comprises (i) an emitter portion and (ii) at least one receiver portion, wherein the emitter portion comprises a first conductive plate, a dielectric disposed overlying a portion of the conductive plate, and a mini emitter, and wherein the receiver portion comprises a second conductive plate, a dielectric disposed overlying a portion of the conductive plate, at least two mini receivers, a reference shield overlying one of the at least two mini receivers, and a shield under test overlying another of the at least two mini receivers.

8. The method of claim 7, further wherein the emitter portion and the at least one receiver portion are positioned with respect to one another on a common platform, wherein the positioning of the emitter and receiver portions on the common platform simulates one or more operating condition of an EMI sensitive application, wherein the common platform comprises one of a conductive platform and a non-conductive platform.

9. The method of claim 8, wherein the test platform further comprises (iii) at least one additional receiver portion, wherein the at least one additional receiver portion comprises a conductive plate, a dielectric disposed overlying a portion of the conductive plate, at least two mini receivers, a reference shield overlying one of the at least two mini receivers, and a shield under test overlying another of the at least two mini receivers, wherein the at least one additional receiver portion is also positioned with respect to the emitter portion on the common platform, wherein the positioning of the emitter portion and the at least one additional receiver portion on the common platform simulates one or more operating condition of the EMI sensitive application.

10. The method of claim 1, wherein each mini receiver comprises a metal layer having an opening formed within the metal layer, a dielectric disposed within the opening, and a receiver antenna extending through the dielectric within the opening.

11. The method of claim 10, wherein the mini receiver with the reference shield further comprises a second dielectric overlying the metal layer and a portion of the dielectric disposed within the opening of the metal layer, wherein the second dielectric includes an opening in the region of the receiver antenna, wherein the receiver antenna extends through the opening in the second dielectric, and wherein the mini receiver with the reference shield further comprises a via wall, the via wall extending from a top surface of the second dielectric, through the second dielectric, and in contact with the metal layer, the via wall further being disposed along a predefined perimeter about the receiver antenna, and a shield coupled to the via wall through a conductive attachment feature.

12. The method of claim 11, further wherein the conductive attachment feature comprises at least one selected from the group consisting of a conductive attachment ring, a conductive attachment band, and a plurality of conductive attachment pads, and still further wherein the via wall comprises one selected from a single via wall and a double via wall.

13. The method of claim 10, wherein the mini receiver with the shield under test further comprises a conductive feature overlying the metal layer and a portion of the dielectric disposed within the opening of the metal layer, wherein the conductive feature includes an opening in the region of the receiver antenna, wherein the receiver antenna extends through the opening in the conductive feature, and wherein the shield under test couples to the conductive feature, and further wherein the conductive feature comprises at least one selected from the group consisting of a conductive coupon, a conductive band, and a conductive ring.

14. The method of claim 1, wherein the mini emitter and the mini receiver with the shield under test are of different types, the different types having been chosen to simulate at least one selected from a given EMI sensitive circuit and a given EMI sensitive circuit application.

15. The method of claim 14, further wherein at least one of the mini emitter and the mini receiver with the shield under test comprises a design for simulating an EMI sensitive circuit application.

16. The method of claim 15, still further wherein the design includes at least one selected from the group consisting of (i) a single symmetric pole for one or both of the mini emitter and mini receiver disposed within a dielectric, (ii) a simple symmetric patch for one or both of the mini emitter and mini receiver wherein the symmetric patch is conductive and disposed overlying a dielectric, (iii) an emitter/receiver having a conductive strip overlying a dielectric, the conductive strip being grounded at one end of the strip, and (iv) an emitter/receiver having a corresponding first strip acting as a transmission line, which is connected to a resistive element which is then connected to a ground via.

17. The method of claim 1, wherein the mini emitter and the mini receiver with the shield under test are arranged with respect to one another for carrying out transverse shielding effectiveness measurements.

18. The method of claim 1, wherein the mini emitter and the mini receiver with the shield under test comprise a plurality of mini emitters and a single mini receiver arranged with respect to each other for carrying out both transverse and normal shielding effectiveness measurements.

19. A method for mini module EMI shielding effectiveness evaluation comprising:
providing a test vehicle including at least one test platform, the test platform having at least one mini emitter, a mini receiver with a reference shield, and a mini receiver with a shield under test;
applying shielding effectiveness transmission signals to the at least one mini emitter; and
evaluating signals received by the mini receiver with a shield under test and the mini receiver with the reference shield, wherein the at least one (i) mini emitter, (ii) mini receiver with the reference shield, and (iii) mini receiver with the shield under test comprise components fabricated concurrently and under fabrication conditions used for fabrication of the at least one test platform of the at least one test vehicle,
wherein each mini receiver comprises a metal layer having an opening formed within the metal layer, a dielectric disposed within the opening, and a receiver antenna extending through the dielectric within the opening,
wherein the mini receiver with the reference shield further comprises a second dielectric overlying the metal layer and a portion of the dielectric disposed within the opening of the metal layer, wherein the second dielectric includes an opening in the region of the receiver antenna, wherein the receiver antenna extends through the opening in the second dielectric, and wherein the mini receiver with the reference shield further comprises at least one via wall, the via wall extending from a top surface of the second dielectric, through the second dielectric, and in contact with the metal layer, the via wall further being disposed along a predefined perimeter about the receiver antenna, and a shield coupled to the via wall through a conductive attachment feature, further wherein the conductive attachment feature comprises at least one selected from the group consisting of a conductive attachment ring, a conductive attachment band, and a plurality of conductive attachment pads, and
wherein the mini receiver with the shield under test further comprises a conductive feature overlying the metal layer and a portion of the dielectric disposed within the opening of the metal layer, wherein the conductive feature includes an opening in the region of the receiver antenna, wherein the receiver antenna extends through the opening in the conductive feature, and wherein the shield under test couples to the conductive feature, and further wherein the conductive feature comprises at least one selected from the group consisting of a conductive coupon, a conductive band, and a conductive ring.

20. An apparatus for mini module EMI shielding effectiveness evaluation comprising:
a test vehicle including at least one test platform, the test platform having at least one mini emitter, a mini receiver with a reference shield, and a mini receiver with a shield under test;
means for applying shielding effectiveness transmission signals to the at least one mini emitter; and
means for evaluating signals received by the mini receiver with a shield under test and the mini receiver with the reference shield, wherein the at least one (i) mini emitter, (ii) mini receiver with the reference shield, and (iii) mini receiver with the shield under test comprise components fabricated concurrently and under fabrication conditions used for fabrication of the at least one test platform of the at least one test vehicle,
wherein each mini receiver comprises a metal layer having an opening formed within the metal layer, a dielectric disposed within the opening, and a receiver antenna extending through the dielectric within the opening,
wherein the mini receiver with the reference shield further comprises a second dielectric overlying the metal layer and a portion of the dielectric disposed within the opening of the metal layer, wherein the second dielectric includes an opening in the region of the receiver antenna, wherein the receiver antenna extends through the opening in the second dielectric, and wherein the mini receiver with the reference shield further comprises at least one via wall, the via wall extending from a top surface of the second dielectric, through the second dielectric, and in contact with the metal layer, the via wall further being disposed along a predefined perimeter about the receiver antenna, and a shield coupled to the via wall through a conductive attachment feature, further wherein the conductive attachment feature comprises at least one selected from the group consisting of a conductive attachment ring, a conductive attachment band, and a plurality of conductive attachment pads, and
wherein the mini receiver with the shield under test further comprises a conductive feature overlying the metal layer and a portion of the dielectric disposed within the opening of the metal layer, wherein the conductive feature includes an opening in the region of the receiver antenna, wherein the receiver antenna extends through the opening in the conductive feature, and wherein the shield under test couples to the conductive feature, and further wherein the conductive feature comprises at least one selected from the group consisting of a conductive coupon, a conductive band, and a conductive ring.

* * * * *